United States Patent [19]

Hirata et al.

[11] 4,180,711

[45] Dec. 25, 1979

[54] DESK-TOP CALCULATOR KEYBOARD SWITCH

[75] Inventors: Osamu Hirata; Yuji Harada, both of Tokyo, Japan

[73] Assignee: Canon Kabushiki Kaisha, Tokyo, Japan

[21] Appl. No.: 833,344

[22] Filed: Sep. 14, 1977

[30] Foreign Application Priority Data

Sep. 14, 1976 [JP] Japan ................................ 52-110046

[51] Int. Cl.[2] ...................... H01H 13/70; H01H 1/02; G06F 15/02; H05K 1/00

[52] U.S. Cl. ................................ 200/5 A; 200/159 B; 200/267; 200/292; 361/398

[58] Field of Search .................. 200/5 R, 5 A, 159 B, 200/264, 266, 267, 268, 292; 364/709, 710, 743; 361/398

[56] References Cited

U.S. PATENT DOCUMENTS

| | | | |
|---|---|---|---|
| 3,728,509 | 4/1973 | Shimojo | 200/264 |
| 3,860,771 | 1/1975 | Lynn et al. | 200/5 R X |
| 3,911,234 | 10/1975 | Kotaka | 200/5 A |
| 3,987,259 | 10/1976 | Larson | 200/5 A |
| 3,988,551 | 10/1976 | Larson | 200/5 A |
| 4,045,636 | 8/1977 | Yoder et al. | 200/5 A X |
| 4,066,851 | 1/1978 | White et al. | 200/5 A |
| 4,081,898 | 4/1978 | Taylor, Jr. et al. | 200/5 A X |

OTHER PUBLICATIONS

IBM Tech. Disc. Bull., Lester et al., "Switch," vol. 11, No. 11, Apr. 1969, p. 1569.

*Primary Examiner*—James R. Scott

*Attorney, Agent, or Firm*—Fitzpatrick, Cella, Harper & Scinto

[57] ABSTRACT

An electronic desk-top calculator includes a bottom casing for the calculator on the inner surface of which bottom casing there are provided fixed contacts, and a flexible plate having thereon pairs of contacts provided with wiring conductors therefor. These pairs of contacts are so arranged at the positions in registry with the fixed contacts as to form a matrix. The fixed contacts act as bridging contacts and comprise electrically conductive material containing carbon particles. The pairs of contacts and wiring conductors have a first electrically conductive layer. An insulative layer of moisture-resistive material overlies the first conductive layer except those terminal ends of the wiring conductor which serve as contacts or electrical connectors. The exposed portions of the first conductive layer which function as switch contacts have an additional layer of electrically conductive material containing carbon particles.

6 Claims, 2 Drawing Figures

DESK-TOP CALCULATOR KEYBOARD SWITCH

BACKGROUND OF THE INVENTION

1. Field of the Invention

This invention relates to an electronic desk-top calculator and more particularly relates to an improvement in the structure of such type of electronic desk-top calculator which is small and thin in size as well as simple in structure.

2. Description of the Prior Art

The calculators of this type according to the prior art are so structured that pairs of contacts and wiring conductors associated therewith are provided on a rigid printed circuit board particularly prepared for this purpose and the pairs of contacts are, upon actuation, brought in contact with movable contacts provided over the pairs. Therefore, in the prior art calculators, key signals have to be led out from the printed circuit board, which necessitates connectors at connecting portions between the circuit board and the display device of the calculators. Moreover, electronic parts have to be mounted on the circuit board per se. Since this structure requires soldering, electrically conductive bonding agents and the like, the manufacturing process of the calculators inevitably becomes complicated.

SUMMARY OF THE INVENTION

Accordingly, it is a general object of the present invention to eliminate the above described disadvantages involved in the conventional electronic desk-top calculators.

A more specific object of the present invention is to provide an electronic desk-top calculator of the above mentioned type in which a plurality of point-like contacts are provided on a bottom casing of the calculator keeping the contacts insulated from each other and a flexible plate is disposed above the contacts, with flexible plate pairs of contacts and wiring conductors associated therewith.

A further object of the present invention is to provide an electronic calculator of the above mentioned type which has a keyboard in which electrically conductive paints are advantageously used.

Other objects and advantages of the invention will become apparent from the following description taken in connection with the accompanying drawings illustrating the preferred embodiment of the present invention.

DESCRIPTION OF THE PREFERRED EMBODIMENT

Figure 1:
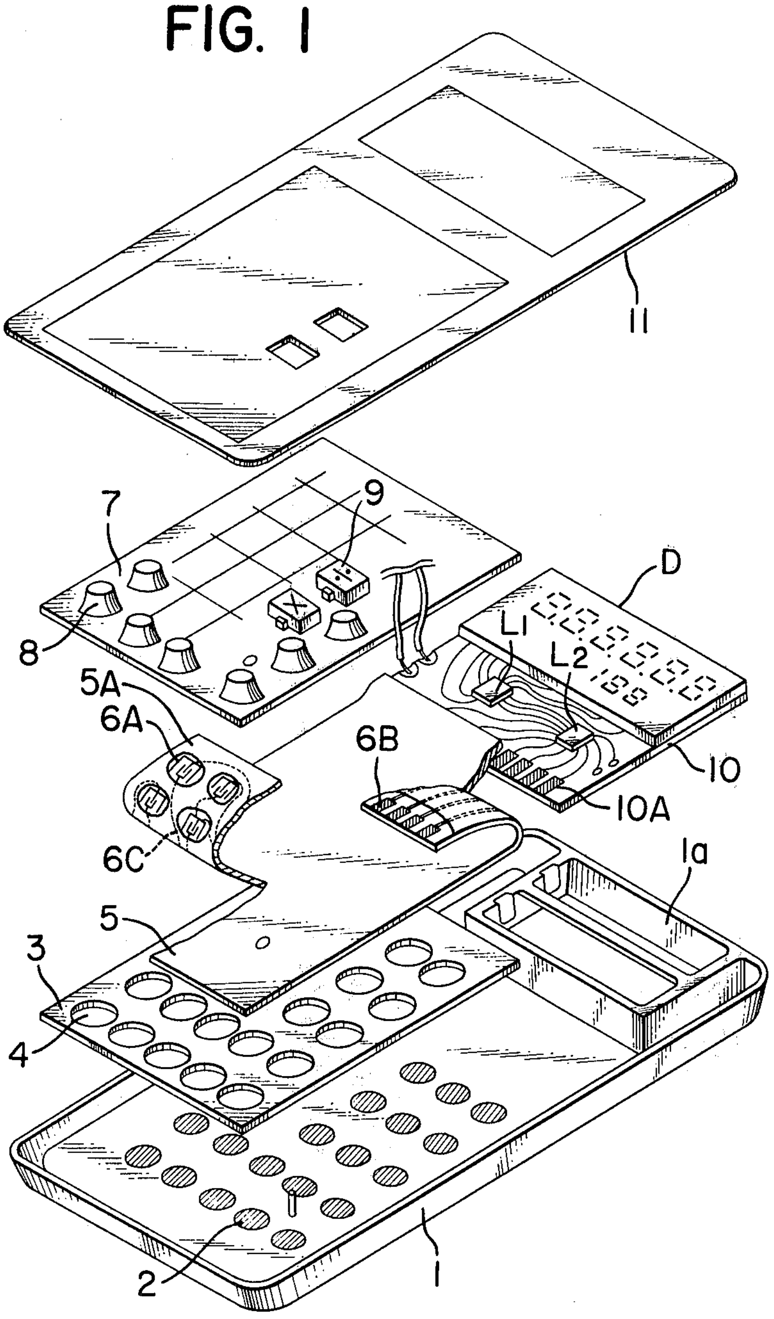
FIG. 1 is an exploded perspective view of an electronic desk-top calculator in accordance with the present invention.

Referring now to FIG. 1, reference numeral 1 designates a bottom casing of an electronic desk-top calculator according to the invention. The bottom casing 1 is made of a suitable organic material such as plastics and has therein a battery receptacle 1*a* integrally formed therewith by molding. On the inner surface of this bottom casing 1, there are disposed a number of point-like fixed contacts 2 which are insulated from each other and arranged in rows and lines of a matrix. These point contacts may be formed by screen printing or off-set printing with electrically conductive paint. Also, a stamp printing method using a rubber plate, or a spray method employing a stencil or roller method may be suitably used to form the contacts 2. Alternatively, the contacts 2 may be formed using any of the above mentioned methods on an insulating, flexible plate overlying the inner surface of the bottom casing 1.

Reference numeral 3 designates a spacer having therein a number of openings 4 in registry with the point contacts 2 on the inner surface of the bottom casing. The spacer 3 may be made of any suitable insulating material such as rubber or plastics.

Reference numeral 5 designates a flexible plate made of polyester, nylon, ethylene propylene rubber or chloroprene rubber. The under surface of the flexible plate is coated with electrically conductive paint by using any of the above described thick film printing methods so as to provide on its surface a number of pairs of contacts and 6A[1], wiring terminals 6B and wiring conductors 6C. Each of the terminals 6B is electrically connected with the associated one of the contacts 10A on a circuit board 10 by using a suitable connecting method such as pressure welding or conductive bonding. On the base plate 10, there are further provided a display device D, operational circuit elements L1 and L2 and other necessary elements.

The function of the fixed contacts 2 is only to make electrical connections between the associated pairs of the contacts 6A and 6A[1] when actuated. Therefore, in order to form these fixed contacts 2 on the inner surface of the bottom casing 1, there may be advantageously used such conductive paint which is prepared by dispersing inexpensive carbon particles with relatively high electric resistance. On the contrary, in order to form the electrical members 6A, 6A[1], 6B and 6C, it is desirable to use conductive paint having a small resistance value prepared, for example, by dispersing conductive particles of metal, such as silver or copper. Otherwise, some deterioration of signals may be caused by the increase in resistance of the circuits because of relatively long electric paths required for the members 6A, 6A[1], 6B and 6C.

Moreover, with the exception of gold, metal is generally apt to be subjected to oxidation and sulfation which will in turn give rise to an increase of electric resistance thereof. For the reason, if the members 6A 6A[1], 6B and the like formed by a coating of conductive paint containing metal particles remain exposed, their contact resistance will be gradually increased. Therefore, to obviate such a problem, it is desirable to overcoat the members 6A 6A[1] and 6B with conductive paint containing carbon particles so as to form a protecting layer 61' therefor. While the same overcoating with the carbon-containing conductive paint may be applicable also to the wiring conductors 6C, it is rather preferable to apply a print-coating of moisture-resisting and insulative paint 5A onto the wiring pattern of conductors 6C or to all over the area of the surface except the contacts 6A and 6A[1] terminals 6B. By doing so, the direct exposure of 6C to the atmospheric environment can be prevented and, therefore, any possible oxidation and sulfation of the conductive particles can be prevented. This is also effective for preventing silver migration which would often occur particularly in the case of silver paint.

Figure 2:
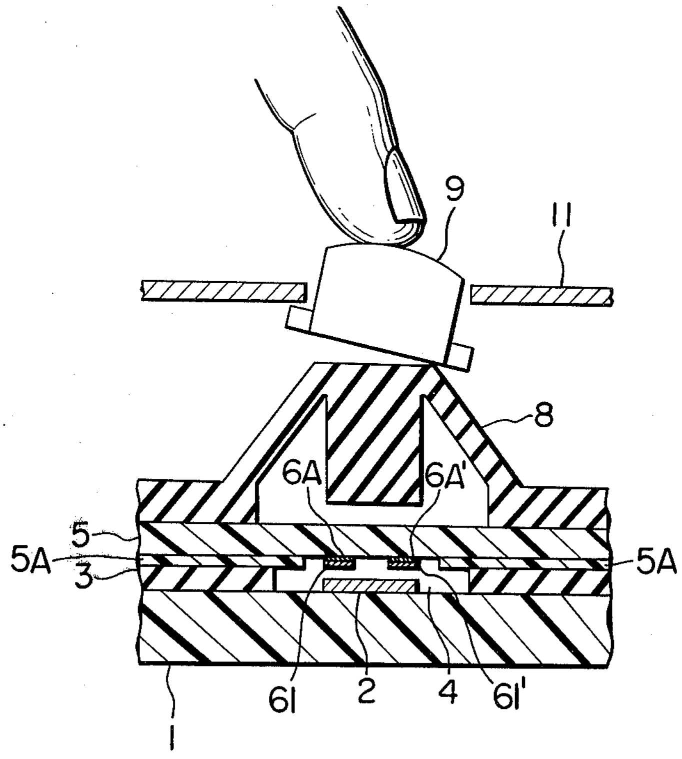
FIG. 2 is a sectional view of a portion of the calculator shown in FIG. 1.

Reference numeral 7 designates a rubber plate having a number of domes 8. As best seen from FIG. 2, the rubber plate 7 functions as a returning spring for key tops 9.

Reference numeral 11 designates a top casing for the electronic desk-top calculator.

What we claim is:

1. A miniature electronic calculator including digit displaying means, operational means and key input means, said key input means comprising:

a casing for the calculator having first electrical contacts disposed on the inner surface thereof, said first contacts being formed of an electrically conductive material containing carbon particles;

an insulating flexible plate having a first electrically conductive layer carried on a surface thereof facing the inner surface of said casing, portions of a surface of said first layer being coated with a second electrically conductive layer of material containing carbon particles to form second electrical contacts for cooperation with said first contacts; and an insulating layer intervening between said first layer and said casing for covering that portion of the surface of said first layer which is not coated with said second layer.

2. A miniature electronic calculator in accordance with claim 1, wherein said first electrically conductive layer is formed of conductive paint containing silver particles.

3. A miniature electronic calculator in accordance with claim 1, wherein said second contacts on the flexible plate comprise pairs of contacts so arranged as to form a matrix, said first electrically conductive layer comprising electric wiring conductors associated with the pairs of said contacts.

4. A miniature electronic calculator in accordance with claim 1, wherein said first contacts on the casing are arranged separately from each other so as to form a matrix.

5. A key input assembly for use in miniature electronic apparatus comprising:

first contact means formed of an electrically conductive material containing carbon particles, said first contact means including a plurality of contacts arranged separately from each other so as to form a matrix;

second contact means including a first electrically conductive layer formed of conductive paint containing silver particles, a second conductive layer of electrically conductive material containing carbon particles overlying portions of a surface of said first layer for making electrical contact with said first contact means, and an insulating layer for covering those portions of the surface of said first layer which are not overlaid with said second layer; and means for making an electrical contact between said first and second contact means;

the portions of said first layer which are overlaid with said second layer of said second contact means being formed as pairs of contacts, the remaining portions of said first layer, which are covered with said insulating layer, including wiring conductors associated with the pair of contacts.

6. A key input assembly in accordance with claim 5, wherein said insulating layer comprises a moisture-resistive material.

* * * * *

UNITED STATES PATENT AND TRADEMARK OFFICE
CERTIFICATE OF CORRECTION

PATENT NO. : 4,180,711

DATED : December 25, 1979

INVENTOR(S) : OSAMU HIRATA, ET AL

It is certified that error appears in the above-identified patent and that said Letters Patent are hereby corrected as shown below:

Column 2, line 19, after "contacts" insert --6A--;

line 53, after "layer" change "61'" to --61--.

Column 4, in Claim 3, last line, before "contacts" insert --second--.

Signed and Sealed this

*Seventeenth* Day of *June 1980*

[SEAL]

*Attest:*

SIDNEY A. DIAMOND

*Attesting Officer* *Commissioner of Patents and Trademarks*